United States Patent
Inai et al.

(10) Patent No.: US 9,023,680 B2
(45) Date of Patent: *May 5, 2015

(54) METHOD FOR PRODUCING COMPOUND SEMICONDUCTOR, METHOD FOR MANUFACTURING PHOTOELECTRIC CONVERSION DEVICE, AND SOLUTION FOR FORMING SEMICONDUCTOR

(75) Inventors: Seiichiro Inai, Higashiomi (JP); Yoshihide Okawa, Higashiomi (JP); Isamu Tanaka, Higashiomi (JP); Koichiro Yamada, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 798 days.

This patent is subject to a terminal disclaimer.

(21) Appl. No.: 13/320,895

(22) PCT Filed: Jul. 27, 2010

(86) PCT No.: PCT/JP2010/062604
§ 371 (c)(1),
(2), (4) Date: Nov. 16, 2011

(87) PCT Pub. No.: WO2011/013657
PCT Pub. Date: Feb. 3, 2011

(65) Prior Publication Data
US 2012/0070937 A1 Mar. 22, 2012

(30) Foreign Application Priority Data

| Jul. 30, 2009 | (JP) | 2009-177632 |
| Aug. 28, 2009 | (JP) | 2009-198390 |
| Aug. 28, 2009 | (JP) | 2009-198391 |
| Aug. 28, 2009 | (JP) | 2009-198428 |
| Oct. 19, 2009 | (JP) | 2009-240313 |

(51) Int. Cl.
H01L 21/00 (2006.01)
H01L 31/032 (2006.01)
H01L 21/02 (2006.01)
H01L 31/046 (2014.01)

(52) U.S. Cl.
CPC ...... *H01L 31/0322* (2013.01); *H01L 21/02491* (2013.01); *H01L 21/02568* (2013.01); *H01L 21/02628* (2013.01); *Y02E 10/541* (2013.01); *H01L 31/046* (2014.12)

(58) Field of Classification Search
CPC . H01L 31/0322; H01L 31/0749; H01L 31/18; H01L 21/02628
USPC ........................................ 438/87, 95
See application file for complete search history.

(56) References Cited

U.S. PATENT DOCUMENTS

| 6,023,020 A | 2/2000 | Nishitani et al. .............. 136/255 |
| 6,992,202 B1 | 1/2006 | Banger et al. ................... 556/28 |
| 7,341,917 B2 | 3/2008 | Milliron et al. ............... 438/285 |
| 8,709,860 B2 * | 4/2014 | Kubo et al. ...................... 438/95 |

FOREIGN PATENT DOCUMENTS

| JP | 10-341029 | 12/1998 |
| JP | 2001-053314 | 2/2001 |
| JP | 2010-118569 | 5/2010 |

OTHER PUBLICATIONS

Japanese language international preliminary report on patentability dated Feb. 2, 2012 and its English language translation issued in corresponding PCT application PCT/JP2010/062604.

* cited by examiner

*Primary Examiner* — Zandra Smith
*Assistant Examiner* — John M Parker
(74) *Attorney, Agent, or Firm* — Procopio, Cory, Hargreaves & Savitch LLP

(57) ABSTRACT

A method for producing a compound semiconductor layer comprises dissolving a metal feedstock comprising at least one of a group I-B element and a group III-B element, in a metal state, in a mixed solvent comprising an organic compound containing a chalcogen element and a Lewis base organic compound to produce a solution for forming a semiconductor; forming a coat using the solution for forming a semiconductor; and heat-treating the coat.

11 Claims, 2 Drawing Sheets

METHOD FOR PRODUCING COMPOUND SEMICONDUCTOR, METHOD FOR MANUFACTURING PHOTOELECTRIC CONVERSION DEVICE, AND SOLUTION FOR FORMING SEMICONDUCTOR

CROSS-REFERENCE TO THE RELATED APPLICATIONS

This application is a national stage of international application No. PCT/JP2010/062604, filed on Jul. 27, 2010, and claims the benefit of priority under 35 USC 119 to Japanese Patent Application No. 2009-177632, filed on Jul. 30, 2009, Japanese Patent Application No. 2009-198390, filed on Aug. 28, 2009, Japanese Patent Application No. 2009-198391, filed on Aug. 28, 2009, Japanese Patent Application No. 2009-198428, filed on Aug. 28, 2009 and Japanese Patent Application No. 2009-240313, filed on Oct. 19, 2009, the entire content of all of which are incorporated herein by reference.

TECHNICAL FIELD

The present invention relates to a method for producing a compound semiconductor and a method for manufacturing a photoelectric conversion device including a compound semiconductor, and a solution for forming a semiconductor for the purpose of forming a compound semiconductor.

BACKGROUND ART

As solar batteries, there are photoelectric conversion devices including a light-absorbing layer composed of a compound semiconductor. As such a compound semiconductor, a chalcopyrite-based compound semiconductor made of CIGS or the like is used. In this photoelectric conversion device, for example, a first electrode layer composed of Mo is formed on a substrate composed of soda-lime glass, and a light-absorbing layer composed of a compound semiconductor is formed on this first electrode layer. Further, a transparent second electrode layer composed of ZnO or the like is formed on the light-absorbing layer through a buffer layer composed of ZnS, CdS or the like.

As the production method for forming a compound semiconductor constituting such a light-absorbing layer, there is used the method using a vacuum device, such as a sputtering method. However, manufacturing cost is high in the method using a vacuum device, and thus various production methods are under development for the purpose of cost reduction in place of the above-mentioned high-cost production method.

For example, U.S. Pat. No. 7,341,917 discloses the technology of obtaining a compound semiconductor by application of a feedstock solution. In the U.S. Pat. No. 7,341,917, first, a metal chalcogenide such as $Cu_2S$ is dissolved in hydrazine ($N_2H_4$) to form a hydrazinium-based precursor solution. After that, this solution is applied onto the electrode layer to form a coat, and then this coat is heat treated, to thereby obtain a metal chalcogenide film (compound semiconductor layer).

Unfortunately, in the method for producing a compound semiconductor as described in the U.S. Pat. No. 7,341,917, the dissolved feedstock concentration is limited to approximately 1% by mass, and the solution for forming a coat has a low viscosity. This makes it difficult to form a good coat of approximately several μm on an electrode layer by a simple method such as the blade process. Therefore, the feedstock solution needs to be applied several times for obtaining a compound semiconductor having a desired thickness, which complicates the steps. Further, as a result of the formation of a compound semiconductor by application of a feedstock solution several times, the heat-treated state differs in the respective layers, and accordingly a stress is apt to be generated between the layers to cause cracks in the compound semiconductor.

In view of the above, the production method capable of producing a compound semiconductor having a desired thickness well easily is desired.

PRIOR ART DOCUMENT

Patent Document

SUMMARY OF THE INVENTION

A method for producing a compound semiconductor according to an embodiment of the present invention comprises producing a solution for forming a semiconductor by dissolving a metal feedstock comprising at least one of a group I-B element and a group III-B element, in a metal state, in a mixed solvent comprising an organic compound containing a chalcogen element and a Lewis base organic compound, producing a coat using the solution for forming a semiconductor, and heat-treating the coat.

A method for manufacturing a photoelectric conversion device according to an embodiment of the present invention comprises, dissolving a metal feedstock comprising at least one of a group I-B element and a group III-B element, in a metal state, in a mixed solvent comprising an organic compound containing a chalcogen element and a Lewis base organic compound to produce a solution for forming a semiconductor, applying the solution for forming a semiconductor onto an electrode to produce a coat, heat-treating the coat to produce a compound semiconductor, and producing a second semiconductor of a conductivity type different from a conductivity type of the compound semiconductor on the compound semiconductor.

A solution for forming a semiconductor according to an embodiment of the present invention is obtained by dissolving a metal feedstock comprising at least one of a group I-B element and a group III-B element, in a metal state, in a mixed solvent comprising an organic compound containing a chalcogen element and a Lewis base organic compound.

EMBODIMENT FOR CARRYING OUT THE INVENTION

Figure 1:
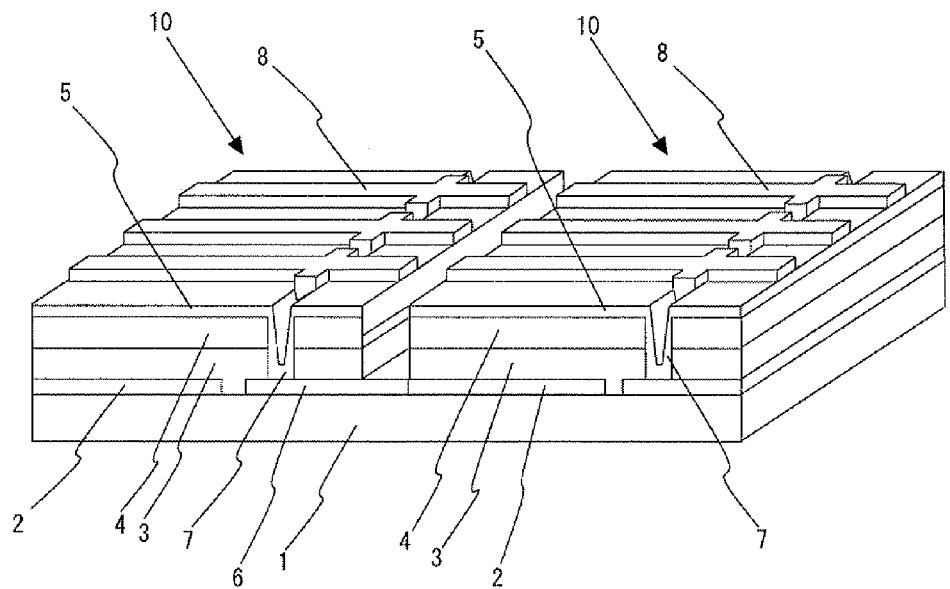
FIG. 1 is a perspective view showing an example of an embodiment of a photoelectric conversion device manufactured by using a method for producing a compound semiconductor according to an embodiment of the present invention and a method for manufacturing a photoelectric conversion device according to the embodiment of the present invention.
Figure 2:
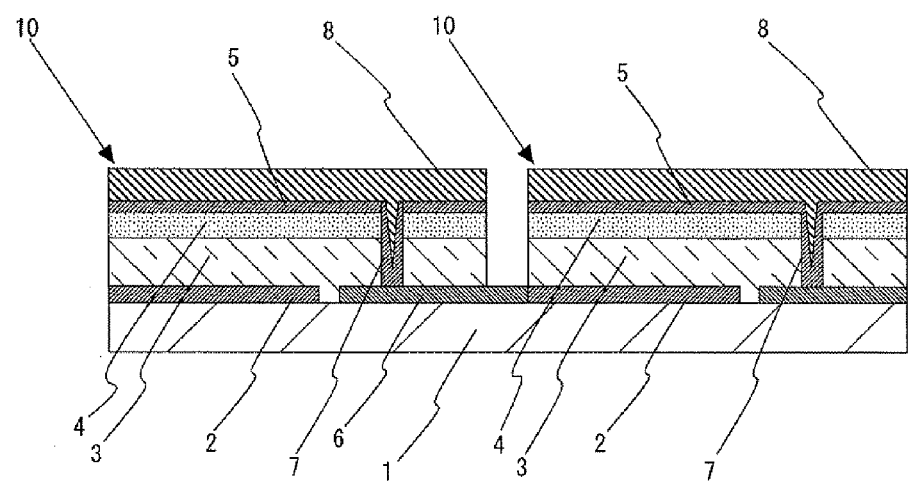
FIG. 2 is a cross-sectional view of the photoelectric conversion device of FIG. 1.
Figure 3:
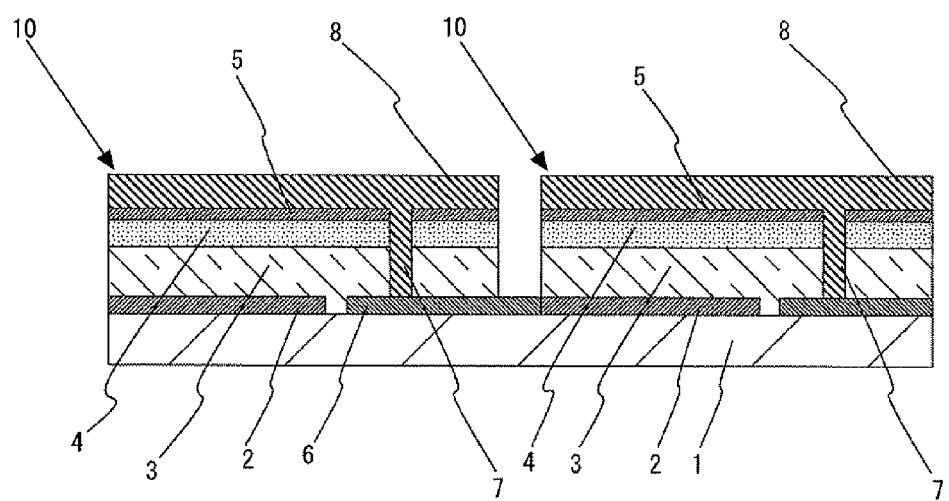
FIG. 3 is a cross-sectional view showing another example of the embodiment of the photoelectric conversion device manufactured by using the method for producing a compound semiconductor according to the embodiment of the present invention and the method for manufacturing a photoelectric conversion device according to the embodiment of the present invention.

Hereinafter, an embodiment of the present invention is described with reference to the drawings. FIG. 1 is a perspective view showing an example of the embodiment of a photoelectric conversion device manufactured using a method for producing a compound semiconductor according to the embodiment of the present invention and a method for manufacturing a photoelectric conversion device according to the embodiment of the present invention, and FIG. 2 is a cross-sectional view thereof. In addition, FIG. 3 is a cross-sectional view showing another example of the embodiment of the photoelectric conversion device manufactured using the method for producing a compound semiconductor according to the embodiment of the present invention and the method for manufacturing a photoelectric conversion device according to the embodiment of the present invention. Ones including the same configurations are denoted by the same reference symbols in FIG. 1 to FIG. 3. A photoelectric conversion device 10 includes a substrate 1, a first electrode layer 2, a light-absorbing layer 3, a buffer layer 4 and a second electrode layer 5. The photoelectric conversion device 10 according to the present embodiment is described as one in which light enters from the second electrode layer 5 side, which is not limited thereto and may be one in which light enters from the substrate 1 side.

In FIG. 1 and FIG. 2, a plurality of photoelectric conversion devices 10 are formed side by side. Further, the photoelectric conversion device 10 includes a third electrode layer 6 provided to be spaced from the first electrode layer 2 on the substrate 1 side of the light-absorbing layer 3. Further, the second electrode layer 5 and the third electrode layer 6 are electrically connected to each other by a connection conductor 7 provided in the light-absorbing layer 3. This third electrode layer 6 is formed integrally with the first electrode layer 2 of the neighboring photoelectric conversion device 10. With this configuration, the neighboring photoelectric conversion devices 10 are connected in series with each other. In one photoelectric conversion device 10, the connection conductor 7 is provided so as to separate the light-absorbing layer 3 and the buffer layer 4, and the light-absorbing layer 3 and the buffer layer 4 sandwiched between the first electrode layer 2 and the second electrode layer 5 perform photoelectric conversion.

The substrate 1 serves to support the photoelectric conversion devices 10. Examples of the material of the substrate 1 include glass, ceramics, resins, and metals.

A conductor of Mo, Al, Ti, Au or the like is used for the first electrode layer 2 and the third electrode layer 6, which are formed on the substrate 1 by, for example, a sputtering method or a vapor-deposition process.

The light-absorbing layer 3 is a layer including a chalcopyrite-based (also referred to as CIS-based) group compound semiconductor as a main component. The group I-III-VI compound is a compound including a group I-B element (herein, group names comply with the old periodic table of IUPAC, and the group I-B element is also referred to as a group 11 element in the new periodic table of IUPAC), a group III-B element (also referred to as a group 13 element) and a group VI-B element (also referred to as a group 16 element). Examples of the group I-III-VI compound semiconductor include $Cu(In, Ga)Se_2$ (also referred to as CIGS), $Cu(In, Ga)(Se, S)_2$ (also referred to as CIGSS) and $CuInS_2$ (also referred to as CIS). Note that $Cu(In, Ga)Se_2$ refers to a compound mainly composed of Cu, In, Ga and Se. Further, $Cu(In, Ga)(Se, S)_2$ refers to a compound mainly composed of Cu, In, Ga, Se and S.

The method for producing the light-absorbing layer 3 includes the first to third steps below. In the first step, a metal feedstock containing at least one of a group I-B element and a group III-B element is dissolved in a mixed solvent including an organic compound containing a chalcogen element and a Lewis base organic compound (hereinafter, the mixed solvent including an organic compound containing a chalcogen element and a Lewis base organic compound is merely referred to as a mixed solvent So as well) in a metal state, to thereby produce a solution for forming a semiconductor. In the second step, the solution for forming a semiconductor is used to produce a coat. In the third step, the coat is heat-treated to be a group I-III-VI compound semiconductor.

The organic compound containing a chalcogen element refers to an organic compound which contains a chalcogen element. The chalcogen element refers to S, Se and Te among the group VI-B elements. In a case where the chalcogen element is S, examples of the organic compound containing a chalcogen element include thiol, sulfid, disulfid, thiophene, sulfoxide, sulfone, thioketone, sulfonic acid, sulfonic ester and sulfonic acid amide. From the perspective of forming a complex with a metal to produce a good metal solution, thiol, sulfid, disulfid or the like can be used. In particular, from the perspective of enhancing coatability, a compound comprising a phenyl group can be used. Examples the compound comprising a phenyl group include thiophenol, diphenyl sulfide and derivatives thereof.

In a case where the chalcogen element is Se, examples of the organic compound containing a chalcogen element include selenol, selenide, diselenide, selenoxide and selenone. From the perspective of producing a good metal solution by the formation of a complex with a metal, selenol, selenide, diselenide or the like can be used. In particular, from the perspective of enhancing coatability, a compound comprising a phenyl group can be employed. Examples of the compound comprising a phenyl group include benzeneselenol, phenyl selenide, diphenyl diselenide and derivatives thereof.

In a case where the chalcogen element is Te, examples of the organic compound containing a chalcogen element include tellurol, telluride, ditelluride and derivatives thereof.

The Lewis base organic solvent is an organic compound comprising a functional group which has a lone pair. A functional group containing a group V-B element (also referred to as a group 15 element) comprising a lone pair and a functional group containing a group VI-B element comprising a lone pair can be used as the above-mentioned functional group. Examples of the functional group include amino groups (any of primary amine to tertiary amine), carbonyl groups and cyano groups. Examples of the Lewis base organic compound include pyridine, aniline, triphenylphosphine, 2,4-pentanedione, 3-methyl-2,4-pentanedione, triethylamine, triethanolamine, acetonitrile, benzil, benzoin and derivatives thereof. From the perspective of handling, there can be used a compound that is generally used as an organic solvent and is liquid at a room temperature. In particular, from the perspective of enhancing coatability, a compound whose boiling point is 100° C. or higher can be used.

In the present embodiment, the mixed solvent (mixed solvent So) including the organic compound containing a chalcogen element and a Lewis base organic compound is used, and thus the high-concentration solution for forming a semiconductor (high concentration means that the total of the feedstocks of the group I-III-VI compound semiconductor, for example, the concentration of a total of a group I-B metal and a group III-B metal or the concentration of a total of a group I-B metal, a group III-B metal and a group VI-B metal is 5% by mass or more, and preferably, 10% by mass or more) can be easily produced by directly dissolving a metal feedstock containing at least one of a group I-B metal and a group III-B metal in a metal state. That is, with the use of the mixed solvent So, solubility can be improved considerably compared with the case of merely using a solvent including only an organic compound containing a chalcogen element or a Lewis base organic compound. The solution having a high concentration as described above serves as a coating solution having a relatively high viscosity, which is suitable for application by a simple process such as a blade process. Accordingly, a relatively thick coat can be obtained well only by one application by forming a coat with using this coating solution, with the result that a compound semiconductor having a desired thickness can be manufactured well easily. Further, the use of the above-mentioned mixed solvent So allows to produce a coating solution without using water, and the use of the above-mentioned nonaqueous coating solution allows to reduce oxidation of a feedstock metal, which enables to produce a good compound semiconductor.

As to the solution for forming a semiconductor, it suffices that at least one of a group I-B metal and a group III-B metal is directly dissolved in the mixed solvent So in a metal state. This enhances solubility, and even when any of a group I-B metal and a group III-B metal is dissolved in a state of an inorganic salt or an organic salt, it is possible to enhance the feedstock concentration of the solution for forming a semiconductor. Further, a group I-B metal and a group III-B metal are both directly dissolved in the mixed solvent So in a metal state, which enables to produce a high concentration solution. Further, in a case where a group I-B metal or a group III-B metal contains a plurality of metal elements, it suffices that any of the metal elements is directly dissolved in the mixed solvent So in a metal state. The embodiment below describes the example in which all of the metal feedstocks including a group I-B metal and a group III-B metal are directly dissolved in the mixed solvent So in a metal state.

The mixed solvent So may be a combination of compounds so as to be liquid at a room temperature from the perspective of handling. The organic compound containing a chalcogen element may be 100 to 150 mol % to the Lewis base organic compound. This allows a group I-B metal and a group III-B metal to be dissolved well, to thereby obtain a solution in which the feedstocks of a group I-III-VI compound semiconductor is 10% by mass or more.

The step of dissolving a metal containing a group I-B element and a metal containing a group III-B element in the mixed solvent So simultaneously or in order is taken as an example of the step of producing a solution for forming a semiconductor (first step). That is, a metal containing a group I-B element and a metal containing a group III-B metal are charged into one mixed solvent So simultaneously or in order and then are dissolved. In this case, a group I-B metal and a group III-B metal serving as the feedstocks of a group I-III-VI compound semiconductor can be dissolved in one mixed solvent So at one time, which simplifies the steps.

The step of dissolving an alloy of a group I-B element and a group III-B element in the mixed solvent So is taken as another example of the step of producing a solution for forming a semiconductor (first step). Also in this case, a group I-B metal and a group III-B metal serving as the feedstocks of a group I-III-VI compound semiconductor can be dissolved in one mixed solvent So at one time, which simplifies the steps.

The step including a plurality of steps as described below is taken as still another example of the step of producing a solution for forming a semiconductor (first step). Those steps include the step of dissolving a group I-B element in part of the mixed solvent So in a metal state to produce a group I-B metal solution, the step of dissolving a group III-B element in the other mixed solvent So in a metal state to produce a group III-B metal solution, and the step of mixing the group I-B metal solution and the group III-B metal solution. In this case, the feedstocks can be easily dissolved at a high concentration by individually dissolving different types of feedstocks in the mixed solvent So, whereby it is possible to obtain a solution for forming a compound semiconductor that is suitable for application. That is, in a case where different types of feedstocks are dissolved simultaneously, while the solubility of the feedstock having a lower solubility is difficult to be enhanced due to a difference in solubility in some cases, good solubility can be obtained by individually dissolving feedstocks.

In a plurality of examples of the step of producing a solution for forming a semiconductor as described above, copper or silver can be used for the group I-B metal as the metal dissolved in the mixed solvent So. The group I-B metal may be one type of element or two or more types of elements. In a case of two or more types of elements, the group I-B metal may be an alloy thereof. Similarly, gallium or indium can be used as the group III-B metal as the metal dissolved in the mixed solvent So. The group III-B metal may be one type of element or two or more types of elements. In a case of two or more types of elements, the group III-B metal may be an alloy thereof.

Note that the fact that a group I-B metal and a group III-B metal are directly dissolved in the mixed solvent So in a metal state refers to directly mixing a group I-B metal and a group III-B metal into the mixed solvent So to be dissolved in a state of the raw metal of an elemental metal or the raw metal of an alloy not in a state of a metal salt or a metal complex. This does not require an additional step of changing the raw metal of an elemental metal or the raw metal of an alloy into other compound (for example, an inorganic metal salt such as a chloride, an organic salt, or an organic complex) once and then dissolving the raw metal in a solvent, which simplifies the steps. Further, it is possible to reduce the inclusion of impurities other than the elements that constitute a group I-III-VI compound semiconductor, whereby the purity is enhanced and the crystallization of a group I-III-VI compound semiconductor can be promoted. Moreover, the step for synthesizing a metal chalcogenide is not required in the present embodiment, which simplifies the steps.

In the solution for forming a semiconductor produced as described above, an organic compound containing a chalcogen element and a group I-B metal element may be bonded well to each other by chemical bonding such as coordinate bonding. Alternatively, an organic compound containing a chalcogen element and a group III-B metal element may be bonded well to each other by chemical bonding such as coordinate bonding. Still alternatively, an organic compound containing a chalcogen element and a Lewis base organic compound may be bonded well to each other by chemical bonding such as coordinate bonding. The bonding as described above enables to form a coat described below while keeping the state in which an organic compound containing a chalcogen element, a group I-B metal element and a group III-B metal element, which are feedstocks of the group I-III-VI compound semiconductor, are in proximity to each other. Accordingly, the reaction of the feedstocks is performed well by heat-treating the coat, which enables to produce a good group I-III-VI compound semiconductor.

The chemical bonding between an organic compound containing a chalcogen element and a group I-B metal element, the chemical bonding between an organic compound containing a chalcogen element and a group III-B metal element and the chemical bonding between an organic compound containing a chalcogen element and a Lewis base organic compound can be confirmed by, for example, the NMR method. In addition, according to this method, the chemical bonding between an organic compound containing a chalcogen element and a group I-B metal element can be detected as a peak shift of multinuclear NMR of a chalcogen element. Moreover, the chemical bonding between an organic compound containing a chalcogen element and a group III-B metal element can be detected as a peak shift of multinuclear NMR of a chalcogen element. Further, the chemical bonding between an organic compound containing a chalcogen element and a Lewis base organic compound can be detected as a peak shift derived from the Lewis base organic compound. The number of moles of the chemical bonding between an organic compound containing a chalcogen element and a group I-B metal element can be set to fall within the range of 0.1 to 10 times the number of moles of the chemical bonding between an organic compound containing a chalcogen element and a Lewis base organic compound. Further, the number of moles of the chemical bonding between an organic compound containing a chalcogen element and a group III-B metal element can be set to fall within the range of 0.1 to 10 times the number of moles of the chemical bonding between an organic compound containing a chalcogen element and a Lewis base organic compound.

Further, above-mentioned step of producing the solution for forming a semiconductor (first step) may include the step of further directly dissolving a group VI-B simple substance containing a chalcogen element such as sulfur or selenium, in addition to a group I-B metal and a group III-B metal. The organic compound containing a chalcogen element used for the solution for forming a semiconductor constitutes the mixed solvent So by being mixed with a Lewis base organic compound and has the function of dissolving a group I-B metal and a group III-B metal as a component of this mixed solvent So, which can be a group VI-B element constituting a group I-III-VI compound semiconductor by heat treatment. In the heat treatment, this group VI-B element decreases by evaporation in some cases, and thus, a group VI-B simple substance may be dissolved separately for supplementing a decrease. This allows the formation of a group I-III-VI compound semiconductor having good photoelectric conversion efficiency. Also in the case where the above-mentioned step of directly dissolving a group VI-B simple substance is included, the use of the mixed solvent So allows the weight concentration of the total of a group I-B metal, a group III-B metal and a group VI-B simple substance to be 10% by mass or more.

In the method of directly dissolving a group VI-B simple substance as descried above, a group VI-B simple substance may be mixed with a group I-B metal and a group III-B metal, and a mixture thereof may be dissolved in the mixed solvent So. Alternatively, a group VI-B simple substance may be directly dissolved in the mixed solvent So to produce a group VI-B simple substance solution, and this may be added to a group I-B metal solution and a metal III-B metal solution.

After the first step as described above, a second step of producing a coat with the use of the above-mentioned solution for forming a semiconductor is performed. The step of applying the thus produced solution for forming a semiconductor onto the first electrode layer 2 as it is to form a coat is taken as an example of the step of producing a coat (second step). The steps can be simplified by using the thus produced solution for forming a semiconductor as a coating solution for forming a coat as it is.

Further, the step including a plurality of steps described below is taken as another example of the step of producing a coat (second step). Such steps include the step of adding a low polar solvent having a polarity lower than that of the Lewis base organic compound to the above-mentioned solution for forming a semiconductor to generate a precipitate, the step of dissolving this precipitate in an organic solvent (hereinafter, an organic solvent in which a precipitate is dissolved is referred to as a solvent for a coating solution) to produce a coating solution, and the step of applying this coating solution onto the first electrode layer 2 to form a coat. This enables to further remove impurities when a precipitate is generated, and further reduces the inclusion of impurities in a coat.

The precipitate generated by the addition of the above-mentioned low polar solvent is precipitated in a state in which a group I-B metal, a group III-B metal and an organic compound containing a chalcogen element are bonded to each other. It suffices that the low polar solvent for generating a precipitate is a solvent having a polarity lower than that of the Lewis base organic compound, and organic solvents such as hexane, heptane, carbon tetrachloride and benzene can be used. Further, the solvent for a coating solution for dissolving a precipitate to obtain a coating solution may be the above-mentioned mixed solvent So or other polar solvent. Examples of the solvent for a coating solution include pyridine and aniline.

The above-mentioned coat is formed by applying the above-mentioned solution for forming a semiconductor or the above-mentioned coating solution onto the surface of the first electrode layer 2 by spin coating, screen printing, dipping, spraying or die coating, and then drying the surface. Drying can be performed under a reducing atmosphere, and the temperature during drying is, for example, 50° C. to 300° C. In this drying, organic components may be subjected to pyrolysis.

Then, the coat is heat-treated, to thereby produce a group I-III-VI compound semiconductor of 1.0 to 2.5 μm. The heat treatment may be performed in a reducing atmosphere for preventing oxidation to obtain a good group I-III-VI compound semiconductor. In particular, any of a nitrogen atmosphere, a forming gas atmosphere and a hydrogen atmosphere can be used as the reducing atmosphere in the heat treatment. The temperature of heat treatment is set to, for example, 400° C. to 600° C. In the heat treatment as described above, a group I-B metal and a group III-B metal of the coat can react with a chalcogen element of an organic compound containing a chalcogen element to form a group I-III-VI compound semiconductor. Further, in a case where a group VI-B element is separately dissolved in the solution for forming a semiconductor as well, the group I-B metal and the group III-B metal can also react with the separately dissolved group VI-B element to form a group I-III-VI compound semiconductor.

Further, a gas containing a chalcogen element may be mixed into the reducing atmosphere in the heat treatment of the coat. In this case, a group I-B metal and a group III-B metal of the coat can also react with a chalcogen element in the reducing atmosphere, and a better group I-III-VI compound semiconductor can be produced. Examples of the gas containing a chalcogen element, which is mixed into the reducing atmosphere, include S vapors, Se vapors, $H_2S$ and $H_2Se$.

The photoelectric conversion device 10 can be obtained by layering a second semiconductor having a conductivity type different from that of the light-absorbing layer 3 on the group I-III-VI compound semiconductor (light-absorbing layer 3). In the method for producing a compound semiconductor according to the embodiment of the present invention, the light-absorbing layer 3 having a desired thickness can be produced well easily, whereby it is possible to easily manufacture the photoelectric conversion device 10 having high photoelectric conversion efficiency by layering the second semiconductor layer on the light-absorbing layer 3.

The second semiconductor has a conductivity type different from that of the light-absorbing layer 3, whereby it is possible to obtain electric power by separating the charges generated by light irradiation well by the light-absorbing layer 3 and the second semiconductor. For example, in a case where the light-absorbing layer 3 is a p-type semiconductor, the second semiconductor is an n-type semiconductor. Note that other layer may be provided at the interface between the light-absorbing layer 3 and the second semiconductor. An i-type semiconductor layer and a buffer layer that forms a heterojunction with the light-absorbing layer 3 are examples of the above-mentioned other layer. In the present embodiment, the buffer layer 4 is provided on the light-absorbing layer 3, and this buffer layer 4 performs the function as the buffer layer that forms a heterojunction with the light-absorbing layer 3 as well as the function as the semiconductor layer that has a conductivity type different from that of the light-absorbing layer 3.

From the perspective of reducing current leakage, the buffer layer 4 may be a layer having a resistivity of 1 Ω·cm or more. The buffer layer 4 may be comprised of, for example, CdS, ZnS, ZnO, $In_2Se_3$, In(OH,S), (Zn,In)(Se,OH) or (Zn,Mg)O, and is formed by a chemical bath deposition (CBD) method or the like. Note that In(OH,S) refers to a compound mainly composed of In, OH and S. (Zn,In)(Se,OH) refers to a compound mainly composed of Zn, In, Se and OH. (Zn,Mg)O refers to a compound mainly composed of Zn, Mg and O. In order to enhance the absorption efficiency of the light-absorbing layer 3, the buffer layer 4 may be light transmissive for the wavelength region of the light absorbed by the light-absorbing layer 3.

The buffer layer 4 may have a thickness of 10 to 200 nm, and further, 100 nm or more. This effectively reduces the degradation of photoelectric conversion efficiency on the conditions of high temperature and high humidity.

The second electrode layer 5 is a transparent conductive film made of ITO, ZnO or the like and has a thickness of 0.05 to 3.0 μm. The second electrode layer 5 is formed by a sputtering method, a vapor deposition process, a chemical vapor deposition (CVD) method or the like. The second electrode layer 5 is a layer having a resistivity lower than that of the buffer layer 4 and serves to extract the charges generated in the light-absorbing layer 3. From the perspective of extracting the charges well, the second electrode layer 5 may have a resistivity of less than 1 Ω·cm and a sheet resistance of 50Ω/☐ or less.

In order to enhance the absorption efficiency of the light-absorbing layer 3, it is preferable that the second electrode layer 5 has light permeability for the light absorbed by the light-absorbing layer 3. From the perspective of enhancing light transmittance and simultaneously enhancing a light reflection loss reduction effect and a light scattering effect, and from the perspective of transmitting the current generated by photoelectric conversion well, the second electrode layer 5 may have a thickness of 0.05 to 0.5 μm. In addition, from the perspective of preventing light reflection loss at the interface between the second electrode layer 5 and the buffer layer 4, the second electrode layer 5 and the buffer layer 4 may have an equal refractive index.

In the photoelectric conversion device 10, the portion including the buffer layer 4 and the second electrode layer 5, that is, the portion sandwiched between the light-absorbing layer 3 and a collector electrode 8 may include a group III-VI compound as a main component. This improves moisture resistance. The fact that a group III-VI compound is included as a main component indicates that a group III-VI compound (in a case of a plurality of types of group III-VI compounds, the total thereof) to the compounds constituting the portion including the buffer layer 4 and the second electrode layer 5 is 50 mol % or more, and further, 80 mol % or more. From the perspective of further improving the moisture resistance of the photoelectric conversion device 10, a Zn element to the metal elements constituting the portion including the buffer layer 4 and the second electrode layer 5 may be 50 at % or less, and further, 20 at % or less.

A plurality of photoelectric conversion devices 10 are arranged side by side to be electrically connected to each other, to thereby form a photoelectric conversion module. In order to easily connect the neighboring photoelectric conversion devices 10 in series with each other, as shown in FIG. 1 and FIG. 2, the photoelectric conversion device 10 includes the third electrode layer 6 provided to be spaced from the first electrode layer 2 on the substrate 1 side of the light-absorbing layer 3. Further, the second electrode layer 5 and the third electrode layer 6 are electrically connected to each other by the connection conductor 7 that is provided in the light-absorbing layer 3.

The connection conductor 7 is composed of a material having an electric resistivity lower than that of the light-absorbing layer 3. The above-mentioned connection conductor 7 can be formed by forming a groove that penetrates through the light-absorbing layer 3 and the buffer layer 4 and forming a conductor in this groove. As the above-mentioned conductor, the connection conductor 7 can be formed by, for example, forming the groove that penetrates through the light-absorbing layer 3 and the buffer layer 4 and then forming the second electrode layer 5 also in this groove (see FIG. 1 and FIG. 2). Alternatively, the connection conductor 7 may be formed by filling a conductive paste into the groove (see FIG. 3). With reference to FIG. 3, a conductive paste is also filled into the groove that penetrates through the light-absorbing layer 3 and the buffer layer 4 to form the connection conductor 7 when the collector electrode 8 is fainted of the conductive paste. Alternatively, the connection conductor 7 can also be formed by modifying part of the light-absorbing layer 3 and the buffer layer 4 to reduce an electrical resistivity without forming the above-mentioned groove.

Further, the collector electrode 8 may be formed on the second electrode layer 5 as shown in FIG. 1 to FIG. 3. The collector electrode 8 serves to reduce the electrical resistivity of the second electrode layer 5. From the perspective of enhancing light transmissivity, the thickness of the second electrode layer 5 can be made as small as possible, but electrical conductivity is likely to decrease in a case of small thickness. Therefore, it is possible to efficiently extract the current generated in the light-absorbing layer 3 by providing the collector electrode 8 on the second electrode layer 5. As a result, the power generation efficiency of the photoelectric conversion device 10 can be enhanced.

As shown in FIG. 1, for example, the collector electrode 8 is linearly formed from one end of the photoelectric conversion device 10 to the connection conductor 7. This allows the current generated by photoelectric conversion of the light-absorbing layer 3 to be collected in the collector electrode 8 through the second electrode layer 5 and be conducted to the neighboring photoelectric conversion device 10 well trough the connection conductor 7.

From the perspectives of reducing shielding of the light to the light-absorbing layer 3 and achieving conductivity well, the collector electrode 8 may have a width of 50 to 400 μm. Further, the collector electrode 8 may have a plurality of branch portions.

The collector electrode 8 is formed by, for example, pattern-printing a metal paste obtained by dispersing a powdered metal such as Ag in a resin binder or the like, and curing this.

Example 1

The method for producing a compound semiconductor and the method for manufacturing a photoelectric conversion device according to the embodiment of the present invention are evaluated as follows.

Benzeneselenol was dissolved in pyridine to be 100 mol %, to thereby prepare a mixed solvent So. Then, a raw metal of copper, a raw metal of indium, a raw metal of gallium and a raw metal of selenium were directly dissolved in the mixed solvent So, and a sample solution was prepared such that copper, indium, gallium and selenium were 2.3% by mass, 3.2% by mass, 1.3% by mass and 7.2% by mass, respectively (total concentration of copper, indium, gallium and selenium was 14.0% by mass), to the mixed solution So.

Then, the substrate 1 on which the first electrode 2 made of Mo had been formed was prepared, and the sample solution was applied thereonto by a blade process and then dried, to thereby form a coat. The application by the blade method was performed twice in total, and then heat treatment was performed under a hydrogen gas atmosphere. As to the conditions of heat treatment, the temperature was raised to 525° C. for five minutes and maintained at 525° C. for one hour, and then natural cooling was performed to produce a CIGS compound semiconductor layer having a thickness of 2 μm as a sample.

Further, a CIGS compound semiconductor layer of a comparative example was produced as follows. First, copper selenide, indium selenide and gallium selenide were dissolved in hydrazine until a solubility limit is reached. Accordingly, a comparative solution in which the total concentration of copper, indium, gallium and selenide was 0.5% by mass was prepared.

Then, a substrate on which a first electrode layer made of Mo had been formed was prepared, and the comparative solution was applied thereonto by a blade process and dried, to thereby form a coat. The application by the blade process was performed ten times in total, and then heat treatment was performed under a hydrogen gas atmosphere. As to the conditions of heat treatment, the temperature was raised to 525° C. for five minutes and maintained at 525° C. for one hour, and then natural cooling was performed to produce a CIGS compound semiconductor layer having a thickness of 2 μm.

As to the CIGS compound semiconductor layer as a sample produced by the method for producing a compound semiconductor according to the embodiment of the present invention, the feedstock concentration of the sample solution can be increased, and thus a desired thickness of 2 μm was achieved as a result of the only two applications by the blade process. Further, the observation of the produced compound semiconductor layer revealed that the occurrence of cracks was reduced and that a good semiconductor layer was formed.

On the other hand, as to the CIGS compound semiconductor layer of the comparative example, the feedstock concentration of the comparative solution has a limitation and is impossible to reach higher concentration, whereby the thickness of the coat after drying was smaller. Therefore, in the comparative example, it was required to perform application by the blade process as much as ten times for forming the CIGS compound semiconductor layer having the same thickness of 2 μM as that of the sample, which complicates the steps. Further, the observation of the produced compound semiconductor layer of the comparative example revealed the occurrence of cracks.

Example 2

Photoelectric conversion devices were manufactured as follows with the use of the CIGS compound semiconductor layer as a sample produced in Example 1 and the CIGS compound semiconductor layer of the comparative example.

Cadmium acetate and thiourea were dissolved in ammonia water, and the substrate 1 on which the compound semiconductor layer had been formed was immersed therein, to thereby form the buffer layer 4 composed of Cds and having a thickness of 50 nm on the compound semiconductor layer. Further, the transparent second electrode layer 5 comprised of an Al-doped zinc oxide film was formed on the buffer layer 4 by the sputtering method. Finally, an aluminum electrode (extraction electrode) was formed by vapor deposition to produce the photoelectric conversion device 10.

The photoelectric conversion efficiency was measured for each of the thus produced photoelectric conversion device produced with the use of the CIGS compound semiconductor layer as a sample and the thus produced photoelectric conversion device of the comparative example that had been produced with the use of the CIGS compound semiconductor layer of the comparative example. With the use of a so-called fixed light solar simulator for photoelectric conversion efficiency, conversion efficiency was measured under the conditions that the intensity of light irradiation to a light-receiving surface of the photoelectric conversion device 10 was 100 mW/cm$^2$ and that the air mass (AM) was 1.5.

It was revealed that while the photoelectric conversion efficiency of the photoelectric conversion device of the comparative example was 8%, the photoelectric conversion efficiency of the photoelectric conversion device as the sample was superior, 12%.

The present invention is not limited to the above-described embodiment, and various modifications can be made without departing from the essence of the present invention.

DESCRIPTION OF SYMBOLS

1 substrate
2 first electrode layer
3 light-absorbing layer
4 buffer layer
5 second electrode layer
6 third electrode layer
7 connection conductor
8 collector electrode
10 photoelectric conversion device

The invention claimed is:

1. A method for producing a compound semiconductor, comprising:
   producing a solution for forming a semiconductor by dissolving a metal feedstock comprising at least one of a group I-B element and a group III-B element, in a metal state, in a mixed solvent comprising an organic compound containing a chalcogen element and a Lewis base organic compound;
   producing a coat using the solution for forming a semiconductor; and
   heat-treating the coat.

2. The method for producing a compound semiconductor according to claim 1, wherein the organic compound containing a chalcogen element is chemically bonded to the Lewis base organic compound and the metal feedstock in the mixed solvent.

3. The method for producing a compound semiconductor according to claim 1, wherein:
   the metal feedstock comprises the group I-B element and the group III-B element; and
   producing a solution for forming a semiconductor comprises dissolving a metal of the group I-B element and a metal of the group III-B element in the mixed solvent.

4. The method for producing a compound semiconductor according to claim 1, wherein:
   the metal feedstock comprises the group I-B element and the group III-B element; and
   producing a solution for forming a semiconductor comprises dissolving an alloy of the group I-B element and the group III-B element in the mixed solvent.

5. The method for producing a compound semiconductor according to claim 1, wherein:
   the metal feedstock comprises the group I-B element and the group III-B element; and
   producing a solution for forming a semiconductor comprises:
      dissolving a metal of the group I-B element in the mixed solvent to produce a group I-B metal solution;
      dissolving a metal of the group III-B element in the mixed solvent to produce a group III-B metal solution; and
      mixing the group I-B metal solution and the group III-B metal solution.

6. The method for producing a compound semiconductor according to claim 1, wherein producing a solution for forming a semiconductor comprises further dissolving a group VI-B simple substance in the mixed solvent.

7. The method for producing a compound semiconductor according to claim 1, wherein producing a coat comprises applying the solution for forming a semiconductor to form a coat.

8. The method for producing a compound semiconductor according to claim 1, wherein producing a coat comprises:
   adding a low polar solvent having a lower polarity than a polarity of the Lewis base organic compound to the solution for forming a semiconductor to form a precipitate;
   dissolving the precipitate in an organic solvent to produce a coating solution; and
   applying the coating solution to form a coat.

9. A method for manufacturing a photoelectric conversion device, comprising:
   dissolving a metal feedstock comprising at least one of a group I-B element and a group III-B element, in a metal state, in a mixed solvent comprising an organic compound containing a chalcogen element and a Lewis base organic compound to produce a solution for forming a semiconductor;
   applying the solution for forming a semiconductor onto an electrode to produce a coat;
   heat-treating the coat to form a compound semiconductor; and
   producing a second semiconductor of a conductivity type different from a conductivity type of the compound semiconductor on the compound semiconductor.

10. A solution for forming a semiconductor, comprising a mixed solvent comprising an organic compound containing a chalcogen element and a Lewis base organic compound, and a metal feedstock comprising at least one of a group I-B element and a group III-B element, the metal feedstock being dissolved in the mixed solvent in a metal state.

11. The solution for forming a semiconductor according to claim 10, wherein the organic compound containing a chalcogen element is chemically bonded to the Lewis base organic compound and the metal feedstock in the mixed solvent.

* * * * *